United States Patent [19]

Tuckerman et al.

[11] Patent Number: 5,541,524

[45] Date of Patent: Jul. 30, 1996

[54] BURN-IN TECHNOLOGIES FOR UNPACKAGED INTEGRATED CIRCUITS

[75] Inventors: David B. Tuckerman, Dublin; Pradip D. Patel, Redwood City, both of Calif.

[73] Assignee: nChip, Inc., San Jose, Calif.

[21] Appl. No.: 125,941

[22] Filed: Sep. 23, 1993

Related U.S. Application Data

[63] Continuation-in-part of Ser. No. 57,590, May 6, 1993, Pat. No. 5,397,997, which is a continuation of Ser. No. 749,246, Aug. 23, 1991, abandoned.

[51] Int. Cl.⁶ .................................................. G01R 31/02
[52] U.S. Cl. ........................... 324/754; 324/758; 324/760
[58] Field of Search .............................. 324/158.1, 73.1, 324/750, 760, 765; 439/66; 437/8; 29/594, 840; 228/254, 123, 129

[56] References Cited

U.S. PATENT DOCUMENTS

| | | | |
|---|---|---|---|
| 4,281,449 | 8/1981 | Ports et al. | 29/543 |
| 4,453,795 | 6/1984 | Moulin | 439/67 |
| 4,503,335 | 3/1985 | Takahashi | 324/765 |
| 4,717,066 | 1/1988 | Goldenbery et al. | 228/179 |
| 4,749,120 | 6/1988 | Hatada | 228/123 |
| 4,820,876 | 4/1989 | Brown | 324/760 |
| 4,839,587 | 6/1989 | Flatley et al. | |
| 4,859,189 | 8/1989 | Petersen et al. | 439/66 |
| 4,881,591 | 11/1989 | Rignall | 165/26 |
| 4,899,099 | 2/1990 | Mendenhall et al. | 324/754 |
| 4,899,107 | 2/1990 | Corbett et al. | 324/758 |
| 4,926,117 | 5/1990 | Nevill | 324/760 |
| 4,956,605 | 9/1990 | Bickford et al. | 324/760 |
| 4,967,146 | 10/1990 | Morgan et al. | 324/765 |
| 4,968,931 | 11/1990 | Littlebury et al. | 324/760 |
| 5,012,187 | 4/1991 | Littlebury | 324/754 |
| 5,123,850 | 6/1992 | Elder et al. | 439/67 |
| 5,124,639 | 6/1992 | Carlin et al. | 439/482 |
| 5,289,631 | 3/1994 | Koopman et al. | 29/840 |
| 5,309,090 | 5/1994 | Lipp | 219/209 |

OTHER PUBLICATIONS

"Reusable Chip Test Package," A. Bry, et al., *IBM Technical Disclosure Bulletin*, vol. 22, No. 4, Sep., 1979.

"Wafer Burr∝In," G. R. Reinhart, et al., *IBM Technical Disclosure Bulletin*, vol. 26, No. 10A, Mar., 1984.

"Multichip Modules Join Arsenal," Levine, Bernard, *Electronic News*, Jun. 22, 1992, 38:1917.

*Primary Examiner*—Vinh P. Nguyen
*Attorney, Agent, or Firm*—Townsend and Townsend and Crew LLP

[57] ABSTRACT

A device and method for burn-in of bare chips prior to assembly into a multichip module. Each die to be tested is positioned with its I/O pads positioned to face an interconnection burn-in test substrate which may be a silicon circuit board. Each die is temporarily electrically connected to the substrate by a deformable solder bump.

22 Claims, 10 Drawing Sheets

BURN-IN TECHNOLOGIES FOR UNPACKAGED INTEGRATED CIRCUITS

The invention herein described was developed in part in the course of or under contract with the U.S. Air Force, Contract No. F33615-90-C-1481. Accordingly, the government may have certain limited rights in the invention disclosed herein. This application is a Continuation-in-Part of U.S. Ser. No. 08/057,590, filed May 6, 1993 (Attorney Docket No. 14119-6-1) now U.S. Pat. No. 5,397,997, which is a file wrapper continuation of 07/749,246 filed, Aug. 23, 1991 now abandoned.

BACKGROUND OF THE INVENTION

The present invention relates to burn-in technology for integrated circuits and in particular to burn-in technologies for unpackaged integrated circuits for use in Multichip Modules.

A certain percentage of the integrated circuits (ICs) formed in a manufacturing process fail in the first hours or days of use. The infant mortality of the ICs results from latent defects in the device as manufactured. Semiconductor circuits having a relatively large die size and relatively thin gate oxides are particularly susceptible to infant mortality.

The bulk of early failures may be detected by applying power and then supplying a series of test signals to the circuit thereby extensively exercising the circuits at high temperature. Devices which do not respond properly to the test signals or otherwise fail can then be discarded before shipment. This test procedure is called burn-in.

In a typical burn-in process, a large number of packaged ICs are individually mounted on printed circuit boards having a circuit design that permits the ICs to be exercised in parallel. The printed circuit board loaded with ICs is then placed in a burn-in oven. The burn-in oven controls the ambient temperature during the test process. Generally, ICs are burned in for 72 hours or more at temperatures exceeding 100° C.

The burn-in process imposes many significant cost penalties on chip manufacturers. For example, the physical space required to mount individual packaged chips on a few printed circuit boards can consume several cubic feet. The facility space necessary to burn-in a significant number of test assemblies of this size can therefore easily occupy a city block. Furthermore, the power required to heat the burn-in oven and power the ICs is considerable. Assembly of the ICs into sockets onto printed circuit boards is also labor intensive and may damage ICs which might otherwise survive the burn-in process.

In addition to cost penalties, the conventional burn-in process is performance limited. The long lead lines of printed circuit boards and other conventional packaging can create electrical noise and limit the overall operating speed of the circuit to a few MHz. So long as the ICs being tested do not operate faster than the performance of the test circuit board or, alternately if the IC is ultimately to be packaged on a board having similar performance characteristics, the performance limitations of the burn-in test package are of minimal concern.

Figure 1:
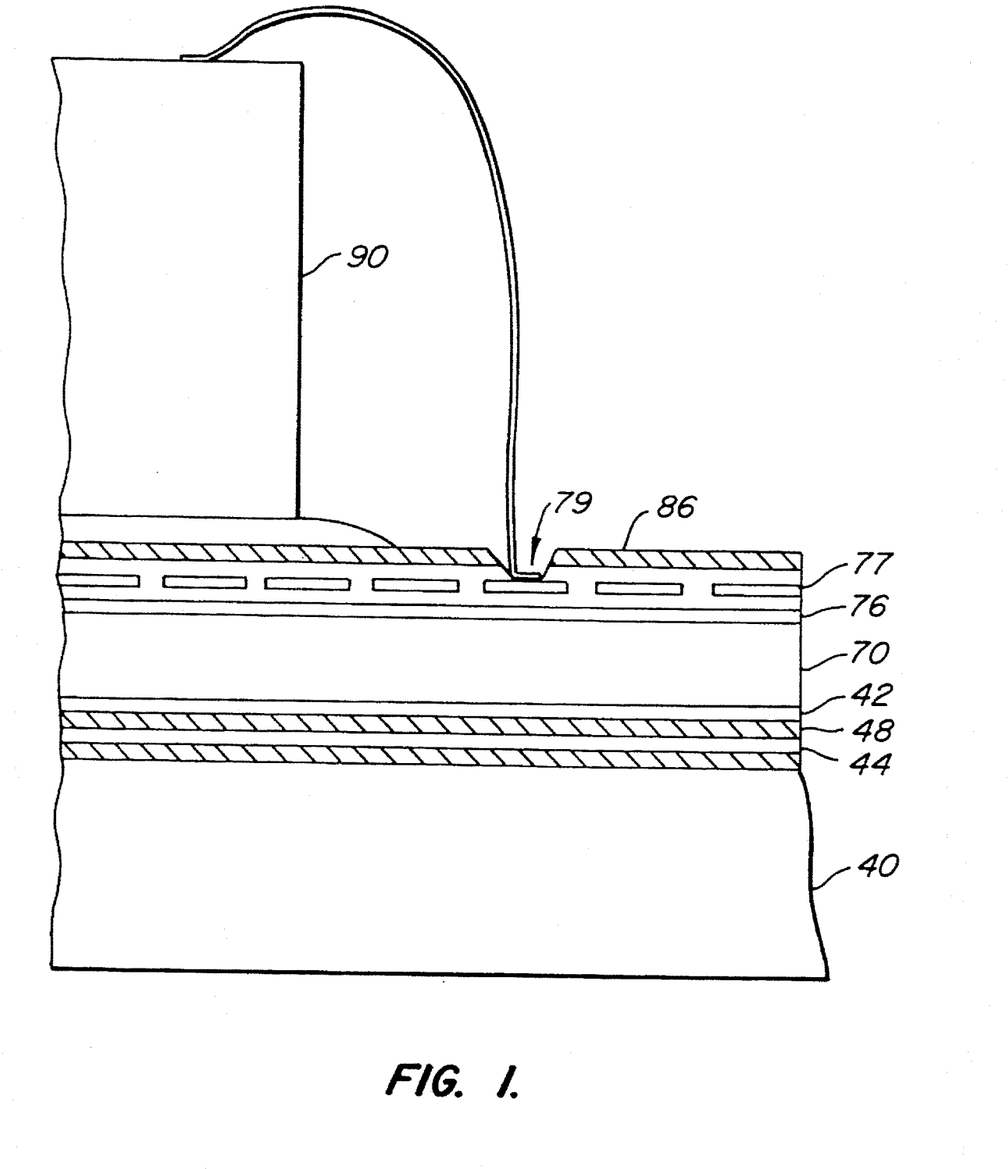
FIG. 1 is a cross-sectional view of a typical multichip module.

Modern ICs, however, are capable of operating in excess of 40 MHz. Therefore, multichip modules (MCMs) are emerging as the packaging and interconnection medium of choice for high performance and on high density electronics systems, both commercial and military. FIG. 1 is a cross-sectional view of one type of MCM. The MCM contains a base high density interconnect substrate (HDI) 40 over which is located conducting power and ground planes 42 and 44. Power and ground planes 42 and 44 are in turn separated from each other by insulating layer 48. Contact to the power and ground planes may be directly made using vias (not shown). Positioned above the power and ground planes is a second dielectric layer 70 which insulates the power and ground planes 42 and 44 from metal interconnect layers 76 and 77. A plurality of ICs 90 attach to the surface of the HDI to form the MCM. ICs 90 contact interconnect layers 76 and 77 through vias 79. The surface of the typical MCM may contain a passivation layer 86. There are a variety of technologies which may be used to implement each of these elements and as stated above, the structure of FIG. 1 is but one example of an MCM structure. A system assembled using MCMs permits system operation at the faster operating speeds of modern ICs in addition to providing cost, size, weight, and reliability advantages over conventional packaging.

Two generic problems of great concern to current and prospective manufacturers of MCMs are test-at-speed and burn-in of the chips. If chips cannot be verified as functional under the desired operating speeds, assembling the chips into an MCM may not gain the desired performance advantages. Even if the chips can be assembled on an MCM and then tested at speed, removal and replacement of embedded chips exacerbates the difficulties of fault isolation, adds significant cost and yield risk to the module, and incurs the need for sophisticated tracking and handling capabilities. Furthermore, the reworked part cannot, in general, be of equal quality to the virgin part.

Even if chips can be satisfactorily pre-tested at speed, chip burn-in losses hinder the ability to manufacture MCMs with reasonable yields. Burn-in losses can be as high as 5% per chip for complex logic chips (e.g., state-of-the-art microprocessors), and are seldom much less than 1% per chip. For example, a 20-chip module in which all the chips have a 5% burn-in failure probability has only a 36% probability of surviving burn-in.

One proposed solution to burn-in losses is to use tape-automated bonding (TAB) technology to burn in the chips on tape prior to module assembly. The tape, however, can warp during extended high-temperature (125°–150° C.) operation, due to different stress relaxation processes in the various metal, adhesive, and polyimide layers of the tape/chip combination. This approach therefore does not satisfy many of the desired burn-in test apparatus criteria.

Manufacturers of MCMs therefore need a reliable method and device for testing individual ICs and conducting burn-in tests prior to assembling the chips onto an MCM. In particular, to minimize handling damage and cost of fixturing, the method and device can ideally be implemented on a wafer scale. In this manner, manufacturers could use a single, instead of multiple, fixturing device.

SUMMARY OF THE INVENTION

The present invention provides a burn-in test assembly and method which permits burn-in tests to be conducted at speed on bare chips.

According to one embodiment of the present invention, a high density interconnect (HDI) substrate is configured as a test substrate for the burn-in tests. The unpackaged ICs to be tested may be located as part of an unsawed device wafer. At those physical locations where an IC device pad is located, a deformable, electrically conductive bump, for example, solder, exists on the surface of the HDI burn-in substrate. The device wafer is aligned with the test substrate and placed against the solder bumps. Electrical contact to the test substrate is thus made through the solder bumps. Because the bumps are deformable and not rigid, contact will be made to all bumps including the lowest, once a force to hold the wafer against the bumps is applied, provided the applied force is sufficiently high. Burn-in tests can then be performed at the desired operating speeds. Once the test is completed, the wafer is removed and sawed into IC chips also known as dice or die. Those chips failing the burn-in procedure are discarded. The solder bumps on the HDI burn-in substrate are then reflowed to restore their original shape and a new device wafer can be tested.

According to another embodiment of the present invention, the heat transfer from the device wafer/test substrate assembly can be actively controlled to provide the desired burn-in temperature. The burn-in oven required in typical burn-in tests therefore can be eliminated.

According to yet another embodiment of the present invention, a method for reflowing the solder bumps employs thin-film heater resistors, integral to the HDI burn-in substrate and directly underneath each solder bump, to momentarily reflow the bump using an electrical pulse. The thin-film heater resistors use the same layer of resistor metallization as is used to define the isolation resistors, so no new process steps are added and hence the cost impact on the substrate manufacture is negligible. No expensive capital equipment, facilities, or hazardous environments are needed. A low-cost pulsed power supply may be used to reflow the bumps, with a small supply of nitrogen blanketing the part to minimize oxidation. The burn-in substrate therefore does not have to be removed from its package for fixturing during the reflow process. Furthermore, because only the bumps themselves are heated for a short period, the detrimental effects of heat and thermal cycling are kept to a minimum, thereby maximizing burn-in substrate lifetime and reusability. The resistor reflow process of the present invention is also very rapid from the user's perspective because in principle, all the bumps can be reflowed simultaneously.

The resistor reflow process requires a minimum of only two additional pins or pads on the substrate. More might be used to minimize power supply size in wafer-scale applications involving very large numbers of bumps. The present invention thus may eliminate the need to conduct burn-in tests on an assembled multichip module. The burn-in substrate of the present invention may also be reused many times thereby reducing test costs. In addition, the die tested by the present invention need not undergo potentially damaging wirebonding, removal and other handling since the die merely rests on the solder bumps. Reductions in test assembly volume and the ability to actively thermally manage the test assembly lead to reductions in the size of burn-in ovens or alternatively to complete elimination of the burn-in oven, thereby providing additional benefits in power consumption, equipment and facilities.

DESCRIPTION OF THE PREFERRED EMBODIMENT

Figure 2:
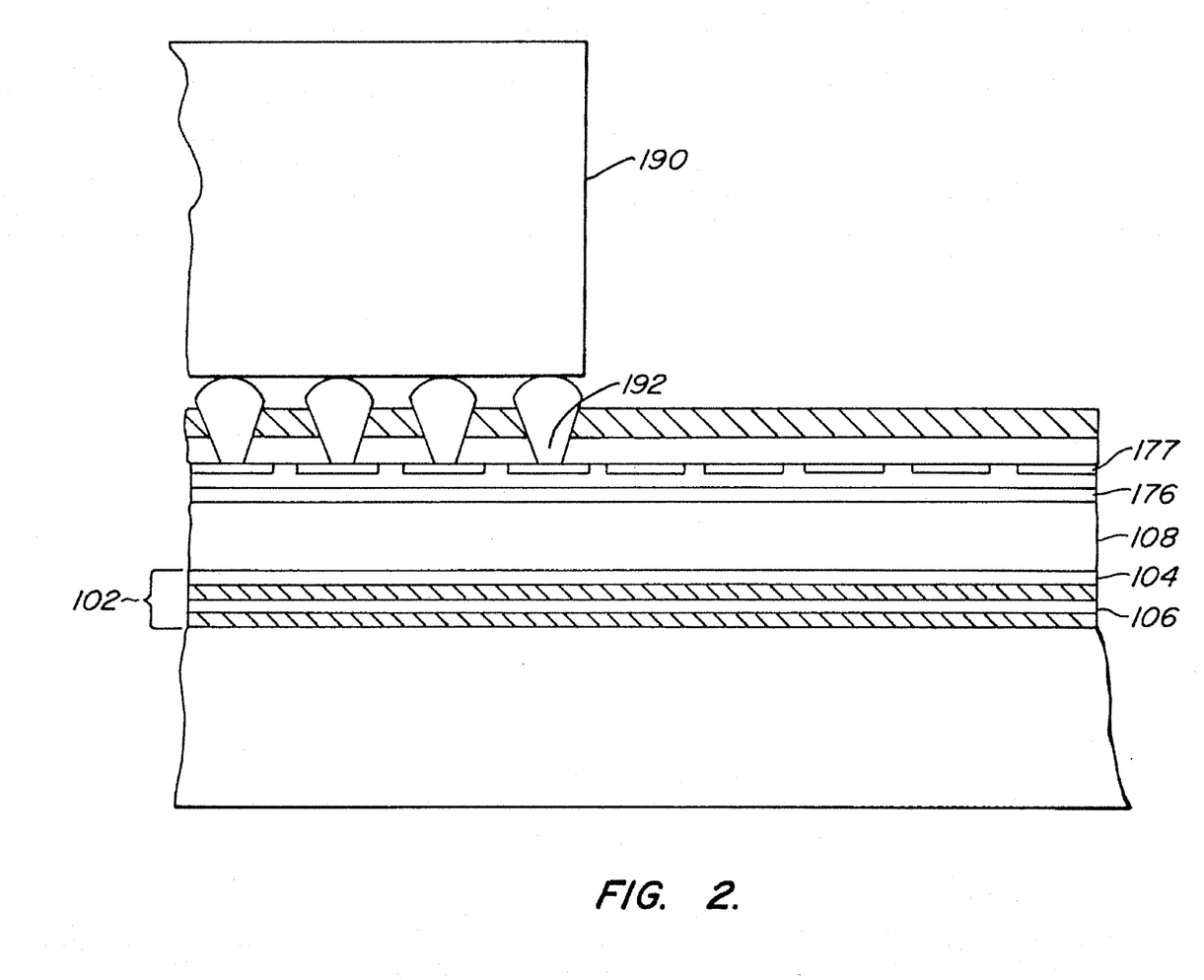
FIG. 2 is a cross-sectional view of a burn-in substrate according to an embodiment of the present invention.

FIG. 2 is a cross-sectional diagram of a burn-in substrate having an HDI similar to that of the multichip module of FIG. 1. The HDI of FIG. 2 has a conducting plane 102 including power and ground planes 104 and 106, insulating layer 108 and layers of interconnect 177 and 176 for electrically contacting an integrated circuit 190. In the structure of FIG. 2, a hemispherical "soft dot", or bump, 192 of electrically conductive material such as solder has been placed, for example, on the surface of metal interconnect layer 177 at the locations where electrical contact is made between layer 177 and 190. The bumps 192 and conductors 177 are positioned on the substrate to align with the bonding pads of the IC's when the IC's are inverted. The chip is inverted and the IC bonding pads contact solder dots 192. IC 190 is merely held against the solder dots 192 with enough force to assure electrical contact and no permanent connection between solder dots 192 and IC 190 is formed. ICs 190 may be individually placed on the burn-in substrate or the ICs may be integral to an unsawed wafer.

With IC 190 pressed against dots 192, the burn-in tests can be performed. Once these tests are completed, integrated circuit 190 is removed and dots 192 are reworked (reflowed) to allow a second integrated circuit 190, or second wafer, to undergo burn-in tests. This process can be repeated many times before failure of the burn-in test assembly. Devices which satisfactorily complete the burn-in test can be assembled onto HDIs to form MCMS.

Figure 2A:
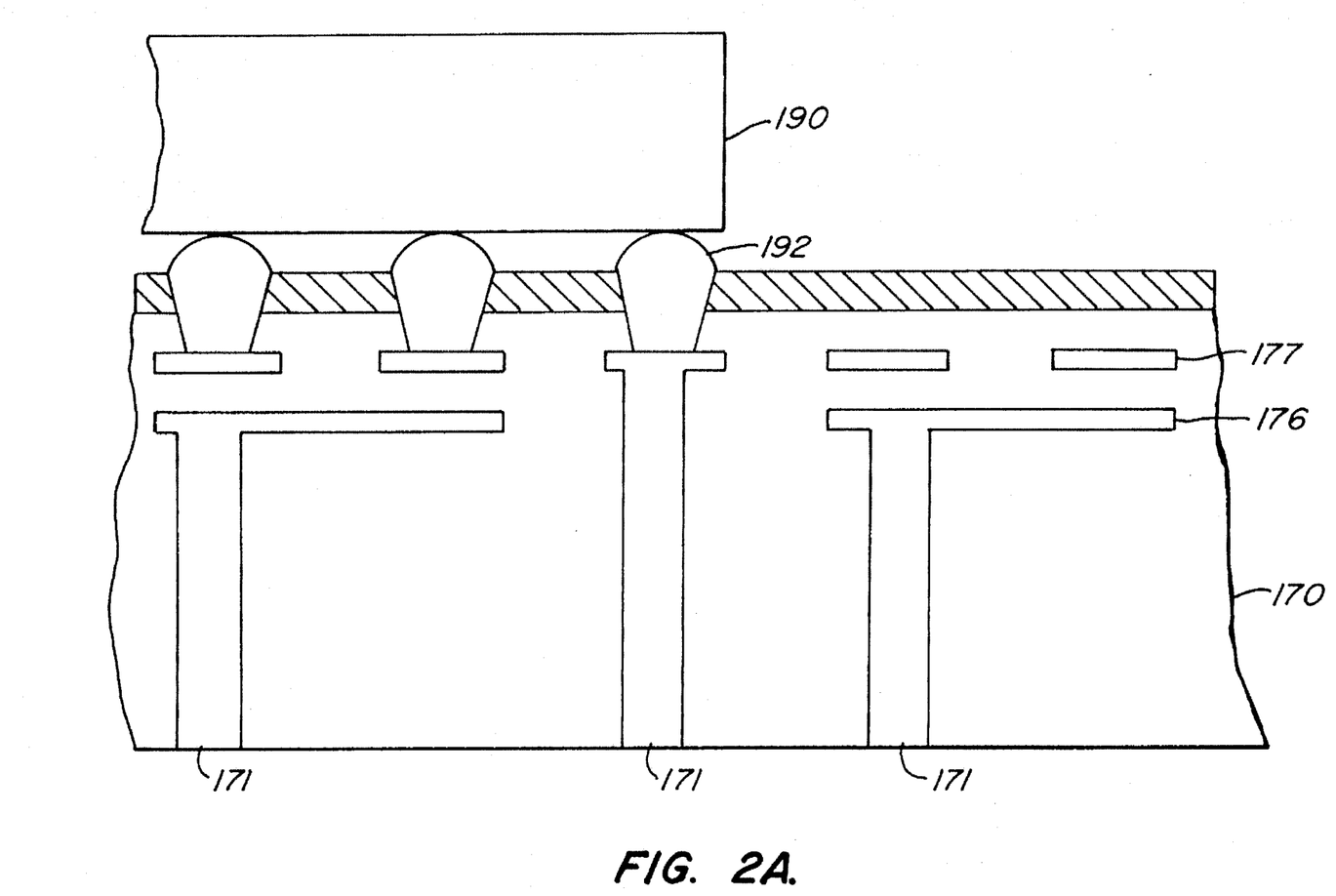
FIG. 2A is a cross-sectional view of a burn-in substrate according to a further embodiment of the present invention.

An alternative embodiment is shown in FIG. 2A. FIG. 2A is a cross-sectional view of a burn-in substrate which contains electrically conductive feedthroughs 171 from the back of the substrate to the layers of interconnect 176, 177. Unlike FIG. 2, the embodiment of FIG. 2A does not have power and ground planes. In the embodiment of FIG. 2A, the base substrate material 170 must either be electrically insulating, e.g., a ceramic material, or if conductive, the feedthroughs 171 must be electrically insulated from the substrate 170 (and from each other) by either a dielectric layer or a reverse-biased p-n junction. The advantage of this embodiment is that electrical signals and power can be fed from the back of the substrate rather than the edges. This enables the use of a smaller burn-in substrate (perhaps as small as the IC wafer 190) and also reduces the wiring complexity in the burn-in substrate.

Test Apparatus

Figure 3:
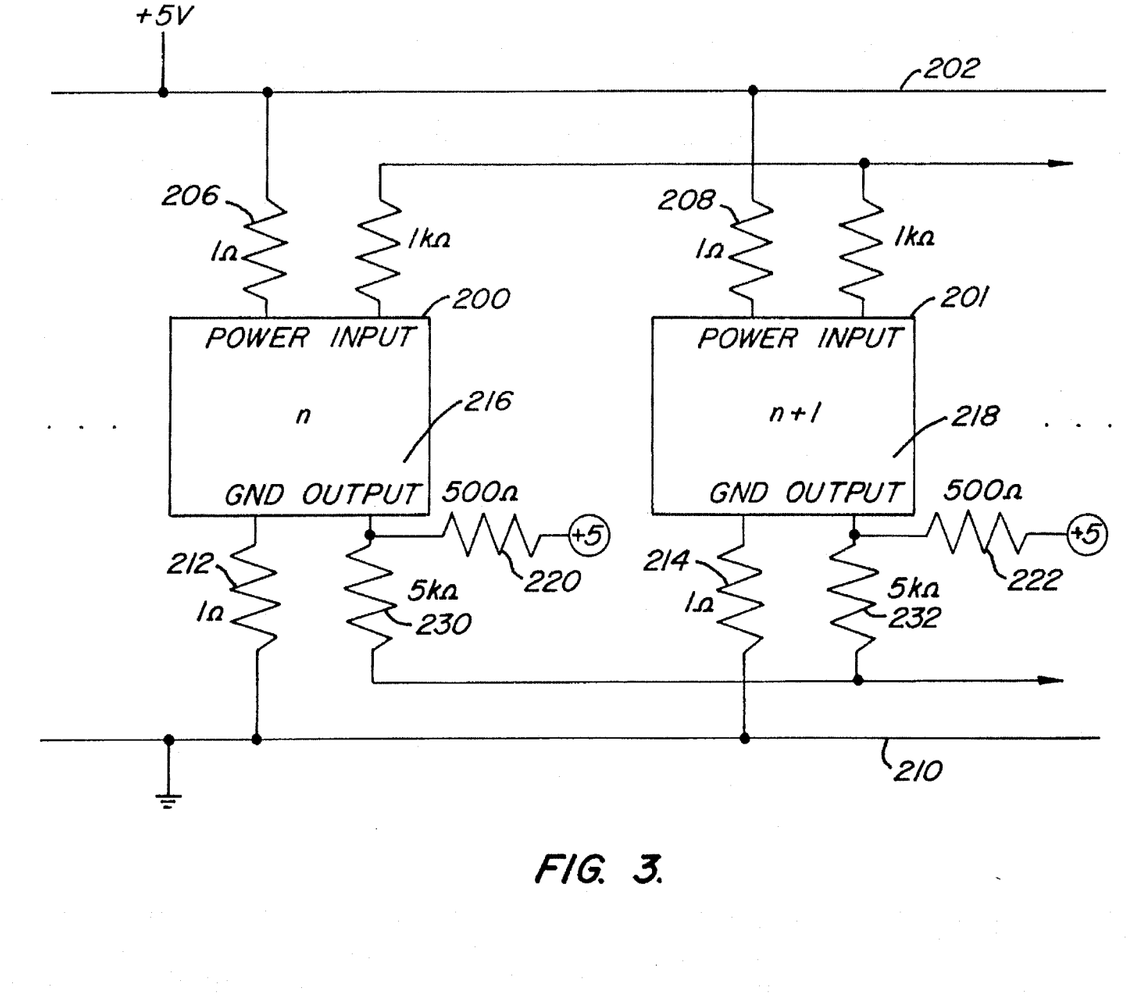
FIG. 3 is a schematic diagram of a burn-in test substrate according to an embodiment of the present invention.

FIG. 3 is a schematic diagram of a burn-in substrate which connects ICs 200 and 201 in parallel so that each chip can be simultaneously and dynamically burned in while power, clock and test vectors are being exercised. In the circuit of FIG. 3, each integrated circuit 200 and 201 is coupled to power plane 202 of the test substrate through isolation resistors 206 and 208, respectively. Similarly, each integrated circuit 200 and 201 is coupled to ground plane 210 of the burn-in substrate through isolation resistors 212 and 214. Isolation resistors 206, 208, 212, and 214 prevent a short in a single test chip from shorting out the entire test circuit.

The output terminals of chips 200 and 201 should be properly loaded, for example with pull-up resistors 220 and 222, to prevent possible unwanted oscillations, without interfering with the test and operation of the remaining chips on the burn-in substrate. The reference voltage to which the pull-up resistor 220 and 222 are coupled may be supplied through an additional power plane or through a metal interconnection of the burn-in substrate.

Of course, not all chips may be functional during testing. Some chips may have faults and thus may have internal short circuits resulting from latch-up or fabrication defects which cause high current drain on specific bond pads. In the circuit of FIG. 3, these potential problems are addressed by inserting isolation resistors 230–232 in series with each integrated circuit output pad before ganging the pads together. Resistors 220–222 and 230–232 may be formed as thin film resistors integral with the burn-in substrate as described in U.S. patent application Ser. No. 07/629,746.

The type of circuit family and the nature of the pad determine what value of resistor is appropriate. For example, a resistance of ~1 k$\Omega$ per pad isolates input terminals of ganged chips from each other, without consuming excess power or impairing the ability to apply high-frequency test vectors to the chips. Output pads may be wired together with 5 k$\Omega$ isolating resistors, so that the mean output level can be sensed at the periphery of the burn-in substrate, yet the isolating resistors are sufficiently high that this mean level does not act as an undesired pull-up or pull-down on individual output terminals. In addition, each output terminal can have its own personal pull-up or pull-down resistor to a power or ground rail, as required by the logic family. In a typical application, this resistor might be 500 or 1000$\Omega$. For pads which can act as either inputs or outputs (e.g., tri-state drivers used in bus structures), the circuitry is analyzed to determine the optimal resistor value. A potential inability to clock the chips at their maximum speed due to RC delays resulting from the use of isolation resistors is not likely to be important since dynamic burn-in is normally performed at a very nominal clock speed (for example, 1 MHz).

In contrast to the input and output pads, the power supply pads require a very low value of isolation resistance, on the order of 1$\Omega$ per pad, to avoid excess voltage drop. Limiting voltage drops can be particularly critical for devices which draw DC current, for example, ECL technology. In order to provide a uniform voltage across the wafer, the effective resistance of the power distribution system (power and ground planes) should be substantially lower than the resistance of the isolation resistors. The magnitude of the voltage drop on the power feeds which can be tolerated during burn-in is greater than what would be tolerable in an actual system application. This difference is because, for burn-in, the only interest is in exercising the chips, and overall system noise margins are not a concern. However, if desired, the overall power supply voltage may be increased slightly to compensate for voltage drops in the isolation resistors 206–214, thereby ensuring that all chips receive a minimum specified burn-in voltage.

Isolation resistors are chosen so a dead short can be accommodated without disrupting the rest of the IC's and without burning out the isolation resistor. Burning out the isolation resistor would make the test substrate nonreusable. The approach in which chips are ganged together in parallel, with isolation resistors on all the pins, also suffers from a potential problem if the die yield is low. For example, if the die yield is only 10%, then most of the chips on the wafer are nonfunctional. The nonfunctional chips could create a massive drain on the power supply (if short-circuited) and also make it impossible to evaluate whether the good chips are behaving correctly (since the output pins will be the mean of all the output levels, and if 90% of these output levels are incorrect then the result will be noise). Low-yielding wafers can be subjected to a selective laser ablation process (in which the bond pads are vaporized with a short-wavelength excimer laser, exposing the underlying glass) so that these chips do not get powered up (nor do any of the bond pads get connected) when mated to the burn-in test substrate. Alternatively, a coining tool can be used to coin those bumps necessary to disable chip operation. For example, a solder bump which provides contact to power or ground may be coined such that the bump height is sufficiently lower than the height of the other bumps such that the wafer does not contact the coined bump.

Possible routing difficulties in parallel ganging of the chips on the burn-in substrate may be avoided by providing multiple layers of interconnect on the burn-in substrate. Similarly, multiple power and ground planes may be used to increase the amount of current which can be supplied to the test wafer. Multiple power and ground planes may prove particularly useful in testing of emitter coupled logic (ECL) and gallium arsenic (GaAs) circuits having device wafer power consumptions in excess of 1 kW or multiple power supply voltage levels.

External electrical connections to the burn-in substrate supply test signals and power to pins or pads surrounding the burn-in substrate. The burn-in substrate thus is preferably physically larger than the device wafer.

An alternative embodiment would allow multiple pieces of burn-in substates, which together would cover an area physically larger than the device wafer. However, if the burn-in substrate contains conductive feedthroughs 171 as shown in the embodiment of FIG. 2A, it would be possible to make the burn-in substrate 170 identical in size to the device wafer 190 as all connections could be made from the back of the burn-in substrate.

Various connectors, including a gold dot or fuzz button type connector mated to a high temperature flex circuit, or a "pogo" connector mated to a ceramic interface board can be used to connect to the burn-in substrate. Ideally, the connector chosen can tolerate high temperatures without welding to or contaminating the contact pads.

Figure 4:
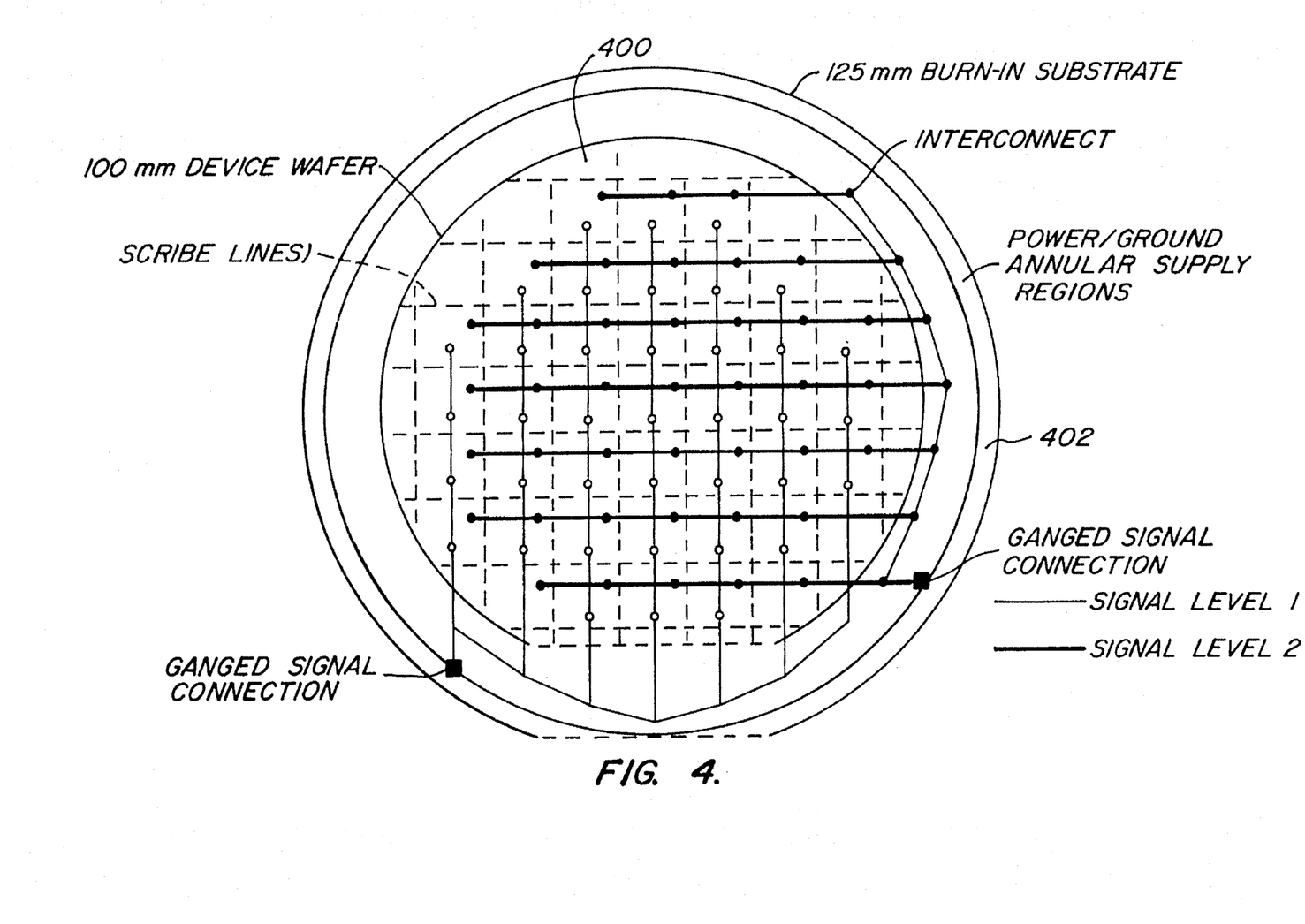
FIG. 4 is a top view of a device test wafer connected to a burn-in test substrate according to an embodiment of the present invention.

FIG. 4 is a top view of a test wafer 400 connected to burn-in substrate 402. The structure shown includes substrate 402 illustrating the ganged signal connections for two signal levels. Not seen in the top view diagram of FIG. 4 are the power and ground planes which lie underneath the signal level. Annular regions on the periphery of the substrate provide desired potential supplies, typically power and ground to appropriate connections traversing the substrate. As described above, the wafer is face to face against the burn-in substrate so bonding pads on each chip contact the substrate at desired locations to receive input signals, detect output signals, and supply necessary power levels.

Dot Fabrication Techniques

A variety of techniques can be used to form the solder dots (bumps) on the contact pads of the burn-in substrate. (Alternatively, the solder dots may be formed on the contact pads of the IC.) One known technique for forming solder dots is electroplating through a photoresist mask. Another technique involves gold "ball bumping" followed by solder dipping. A third is directly forming the solder ball by ball bumping of solder wire. Gold ball bumping techniques are described in Kulicke and Soffa Industries, Willow Grove, Pa. wire bonder product literature, and in U.S. Pat. No. 4,717,066 to Goldenberg, et al. Palladium-doped gold wire is used in a conventional wire bonder (ball bonder). Wire from Hydrostatics, Inc. of Bethlehem, Pa. (98%+Au-Pd, 0.001" diameter, 1–3% elongation, 26.5–27.0 gm break strength) is also suitable for forming the solder bumps. A Kulicke and Soffa 1419 wire bonder with "Dawn G.1" software has been found satisfactory for use with the Hydrostatics wire in the present invention to form the contact bumps.

Figure 5A:
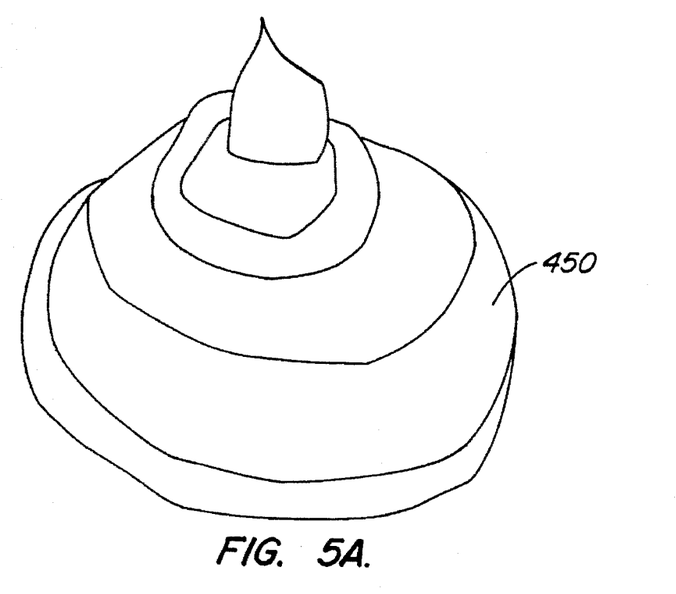
FIG. 5A is a view of a gold ball formed according to an embodiment of the present invention.
Figure 5B:
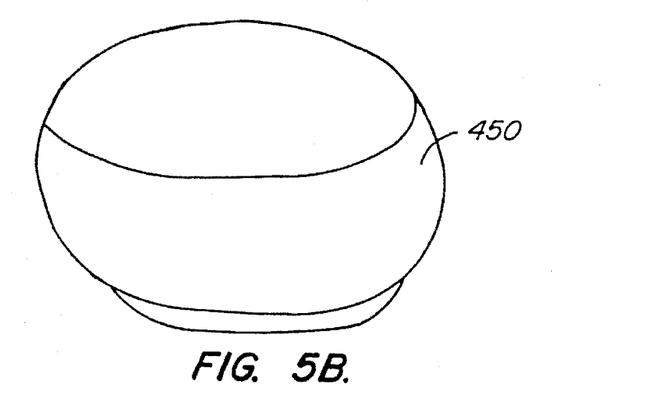
FIG. 5B is a view of a gold ball coined to form a planar surface according to an embodiment of the present invention.

Using the equipment and wire described, the presence of the palladium in the gold wire results in a brittle intermetallic at the neck of the ball bond, such that the wire "automatically" severs at the neck in the course of normal bonding. This yields gold balls 450 having the appearance shown in FIG. 5A. Bump 450 is then "coined" with a special tool, such as used in tape automated bonding, to produce a planar surface as seen in FIG. 5B for solder dipping. The ball may be coined with a 6-mil square tool from Gaiser Tool Company, Ventura, Calif., resulting in a height distribution ranging from 35 to 37 μm (standard deviation=0.5 μm) as measured with a high-power optical measuring microscope. Balls made with this process had a 70 gm average shear strength after 24-hour storage at 150° C. The resultant ball diameter is approximately 2.5–2.75 mil, and has been proven useable with ICs having a pad pitch as small as 6 mil.

The gold balls are preferably coated with approximately 0.5 mil of electroless nickel prior to solder dipping, to reduce intermetallic formation. The coating reduces the tendency to form brittle intermetallics during subsequent flow and also enables the use of soft solder such as Pb-Sn.

Figure 5C:
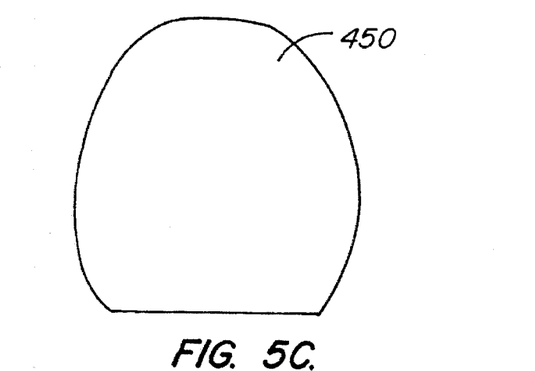
FIG. 5C is a view of a gold ball dipped in solder according to an embodiment of the present invention.

After formation of the gold bumps and nickel plating, the substrate is fluxed with an "R" type (nonactivated) rosin, and manually dipped for 5 seconds in a 325° C. static solder pot (Marshall Industries) of 75–25 (wt.) lead-indium solder supplied by Indium Corporation of America. The Pb-In alloy minimizes gold leaching and enhances wetability of the gold balls when a nickel barrier is not used. Also, the Pb-In is believed less prone to oxidation than other alloys. A layer of tinning oil on the surface of the solder pot may be used to minimize solder oxidation. FIG. 5C shows the ball after solder dipping.

Mating of the Wafer/Chip to the Burn-In Substrate

Wafers and their associated ICs, or the individual chips themselves, are not fixedly mounted to the solder bumps, but are held against the solder bumps by applying an external force. Several techniques may be used to hold the electrically active surface of the wafer/die structure against the contact bumps with sufficient force to ensure excellent electrical contact. The exact amount of pressure required will vary with the type of material used to fabricate the bumps and with the coplanarity of the bumps. An average force of 30 grams per dot typically is sufficient to provide the desired contact.

Figure 6A:
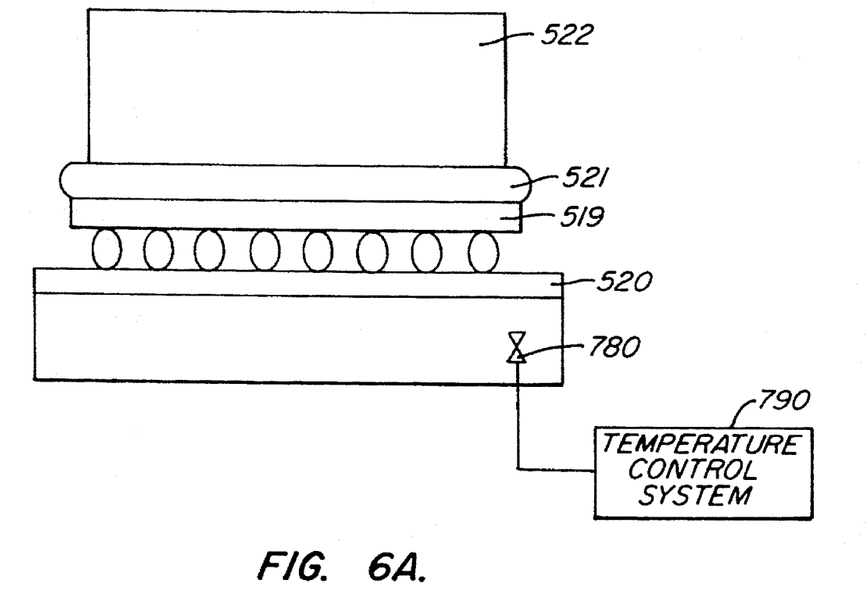
FIG. 6A is a side view of a test wafer held in position on a burn-in test substrate by a pneumatic piston according to an embodiment of the present invention.

One method for holding the die against the bumps is the use of a hydraulic or pneumatic piston as seen in FIG. 6. A liquid filled bag made of high strength plastic may be inserted between the piston and the wafer assembly to provide a uniform hydrostatic pressure loading on the device wafer. The liquid filled bag avoids problems of nonuniform loading caused by tilt of the chip or wafer with respect to the piston or the substrate. In FIG. 6A, the test wafer 519 is positioned on substrate 520. Fluid filled bag 521 is located between wafer 519 and piston 522.

Figure 6B:
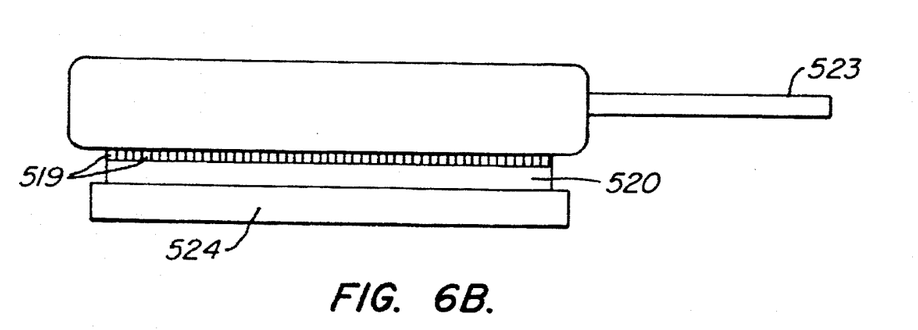
FIG. 6B is a side view of a test wafer held in position on a burn-in test substrate by an inflatable bladder according to an embodiment of the present invention.

Alternatively, an inflatable bladder as shown in FIG. 6B and described in U.S. Pat. No. 4,968,931 to Littlebury et al. may be used. Preferably, the bladder is liquid filled for improved safety. In FIG. 6A the test wafer 519 is positioned on substrate 520 and held in place by bladder 523. A heat sink 524 may be attached to substrate 521.

Figure 7:
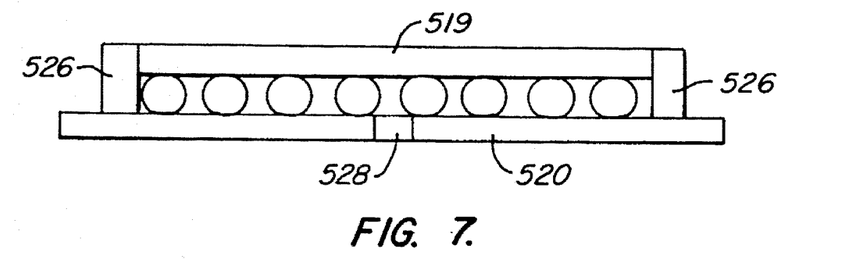
FIG. 7 is a cross-sectional view of a test wafer held in position on a burn-in test substrate by applying a vacuum pressure according to an embodiment of the present invention.

If the required contact pressure to secure test wafer 519 is less than 12 pounds per square inch (83 kPa), atmospheric pressure may be used by creating a vacuum between the device wafer and the electrically active surface of the burn-in substrate as shown in FIG. 7. To create the vacuum, a temporary seal is first fashioned between the edge of the device wafer 519 and the burn-in substrate 520 using an elastomer material 526. With the seal in place, the resulting interior cavity is evacuated through an opening 528 in the substrate, for example, as drilled by a laser. The magnitude of the force exerted on the device wafer also can be controlled by creating a partial vacuum. The vacuum approach requires less fixturing and thus permits more test wafer/burn-in substrate combinations to fit inside the burn-in oven than if an external bladder or piston is used.

Figure 7A:
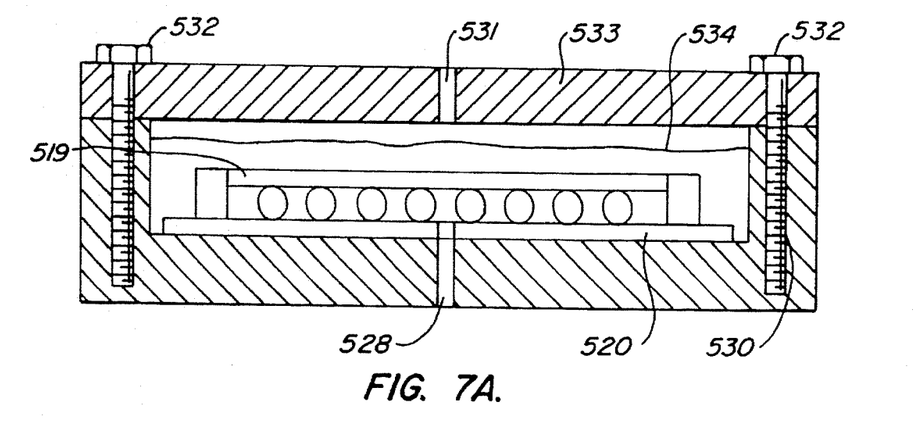
FIG. 7A is a cross-sectional view of a test wafer held in position on a burn-in test substrate by applying a differential pressure in a pressure vessel according to an embodiment of the present invention.

In another embodiment, the vacuum hold-down technique described above may be modified to apply pressure greater than 12 psi. In this case, as illustrated in FIG. 7A, the device wafer 519 and burn-in substrate 520 are enclosed in a pressure vessel 530 which is sealed shut using high-strength bolts 532 and which is pressurized through hole 531 with a high-pressure gas such as nitrogen. The vacuum hole 528 provides access to a vacuum pump or to ambient atmospheric pressure air. The net applied pressure will be the difference between the pressurized gas (measured in hole 531) and the vacuum hole pressure (measured in hole 528).

Other pressurized gases such as helium or air may also be used in the pressure vessel 530. Helium has the particular advantage of being a superior heat conductor and will enhance the transfer of heat from the device wafer to the burn-in substrate, which is in turn in thermal contact with the base of the pressure vessel 530. More generally, the pressure vessel may be pressurized with any fluid, i.e., a gas or a liquid. A liquid can be advantageous when the device wafer dissipates a large amount of heat, i.e., >1 kW. For example, the pressure vessel could be partially filled with up to a level 534 with an inert liquid such as a "Fluorinert"®, with the remaining space occupied by the liquid's own pressurized vapor. The liquid is chosen such that, at the desired operating pressure, the liquid boils at approximately the desired burn-in temperature for the device wafer. The upper portion 533 of the vessel could function as a condensor for the vapor, particularly if cooling channels for a coolant were incorporated into portion 533, or alternatively the vapor could be condensed elsewhere and then returned to the vessel. The temperature in the vessel may be controlled by various means, but the most precise method would be to regulate the vapor pressure within the vessel, thereby controlling the boiling point of the liquid (in analogy to a pressure cooker). Such regulation techniques are well known to those skilled in the art of designing boilers or refrigeration systems.

Because the solder bumps deform under the contact loading, sufficient mechanical and electrical contact is made to all the solder bumps including the lowest upon application of sufficient contact loading. Furthermore, deformation of the solder balls under this loading may cause the thin oxide coating on the solder balls to crack. This cracked coating is somewhat brittle and serves as an abrasive to scrub away any oxide coating on the chip contact pad. This scrubbing action thereby improves electrical contact between the chip and the test substrate. Optionally, the solder balls may be loaded with an abrasive material such as tungsten powder. This abrasive material then scrubs away the oxide layer on the chip contact pad upon application of the contact loading.

Several techniques can be used to align the device wafer with the burn-in substrate. Infrared alignment may be used, however, this technique requires polishing the back side of the device to be contacted (i.e., the wafer or the IC) to make it transparent to infrared light. Alignment by X-ray examination may also be used. Normally, the wafer or chip is transparent to the X-ray. Solder or gold bumps, however, are visible (absorbing X-rays) under X-ray illumination. To align the wafer with the test substrate, therefore, one or more gold or solder bumps are placed on the surface of the wafer or chip. The bump(s) on the wafer or chip are then positioned so as to line up with similar bumps on the surface of the substrate. Optionally, pit(s) (laser drilled) may be drilled into the surface of substrate and the alignment bump(s) can protrude to mate with the pits.

Thermal Management

With the burn-in technology of the present invention, the burn-in oven itself may be eliminated through proper thermal management and active control loops. This active control of junction temperature is seldom achieved in burn-in of conventionally packaged ICs.

For low-power chips (less than 100 watts/wafer), the wafer's self-heating typically is inadequate to bring the assembly up to the desired temperature. The burn-in substrate may be mounted on a heat spreader such as a copper backing plate as shown in FIG. 6A. The burn-in substrate and burn-in wafer are thus thermally clamped together due to the thermal conduction path provided by the bumps. To provide the necessary heat, a small heater can be attached to or integrated in the copper plate to elevate the temperature. The heat spreader is instrumented with thermocouples 780 to verify operating temperature. Controlling the temperature to the desired level is accomplished by techniques well known to those of skill in the art such as temperature control system 790.

In the medium-power case (100–1000 watts/wafer), the wafer's self-heating is such that the assembly would exceed the desired temperature without any external heat source. Thus, cooling must be provided. Air may be blown over the wafer using a variable-speed fan which is controlled by the thermocouple output. Alternatively, the copper block may be liquid cooled. In this situation it may be necessary to instrument the back of the wafer, because there can be a significant temperature differential between the wafer and the burn-in substrate.

In the high power case (typically $\geq 1$ kw/wafer), the wafer's self-heating is so high that even the solder bumps cannot transfer heat away fast enough. In this case, significant temperature gradients can build up in the horizontal plane of the wafer, that is, hot spots can form in the center of each chip when only perimeter bond pads are used. This problem will be most severe for ECL or GaAs devices which dissipate relatively high power (~20 $W/cm^2$) into a material having relatively poor thermal conductivity. To remove this heat, a liquid-cooled cold plate is pressed against the back of the wafer to obtain a spatially uniform heat-transfer coefficient of 0.5 $W/cm^2$-°C. or greater from the wafer to the cold plate. Commercially available cold plates and a thermal interface medium such as a conventional heat-sink paste may be used. The cooling fluid, for example, silicone oil or water, is recirculated through a radiator to dissipate the waste heat. A control system determines how much of the fluid should bypass the radiator to maintain the desired fluid temperature. The control system is analogous to a thermostat in an automobile engine cooling system.

An alternative method for managing the heat of a high-power wafer would be to use nucleate boiling as the heat transfer method. The device wafer is immersed in an inert liquid and the boiling of the liquid transfers heat from the wafer to the vapor phase of the liquid. The vapor can then be recondensed on another surface, from which the heat is then conducted or convected away. This method is illustrated by FIG. 7A Rework of Deformable Bumps After testing a series of wafers, the deformable bumps may have deformed to the point where sufficient contact between the chips and the test substrate does not occur. At this point, it is possible to reflow the bumps to restore their original shape. The bumps may be reflowed by heating the material past the melting point in a nonoxidizing environment. Reflowing can be accomplished with a hot plate and using flux to prevent oxidation; dipping the substrate in a bath of hot oil; reflowing in a reducing atmosphere of forming gas preventing oxidation; or by using a laser to directly heat the material. To enable reflow without damaging the substrate, the deformable bump material should have a melting point less than the maximum temperature limit of the substrate. This limit value is typically 400° C. Conversely, the melting point must be higher than the burn-in temperatures (typically 125° C. or 150° C.) to prevent reflow or excessive deformation of the bumps during the burn-in process.

The laser reflow process minimizes the time during which the solder bumps are exposed to elevated temperature. A pulse width of 5 or 10 milliseconds for example, is typically sufficient. The short pulse width minimizes the extent to which metallurgical reaction such as intermetallic formation and oxidation of the solder can occur and thereby maximizes the number of times the bumps can be reflowed. Furthermore, the laser reflow localizes the heat to the solder bumps only, allowing the remainder of the burn-in substrate to remain near room temperature. Permitting the burn-in substrate to remain at room temperature greatly simplifies the reflow effort because it eliminates the need to remove all connections and fixturing from the wafer not tolerant of the elevated temperatures required for reflow of solders. Alternatively, the bumps may be reflowed using an embedded thin film resistor (heater resistor) as a source of heat energy. Unlike the laser reflow process, the resistor reflow process is not a sequential process in which each bump is reflowed in succession. Thus, lengthy periods are not required to reflow an entire burn-in wafer. The parallel reflow process of resistor reflow thus reduces the depreciation time that must be charged to each wafer as a result of the reflow process.

Figure 8:
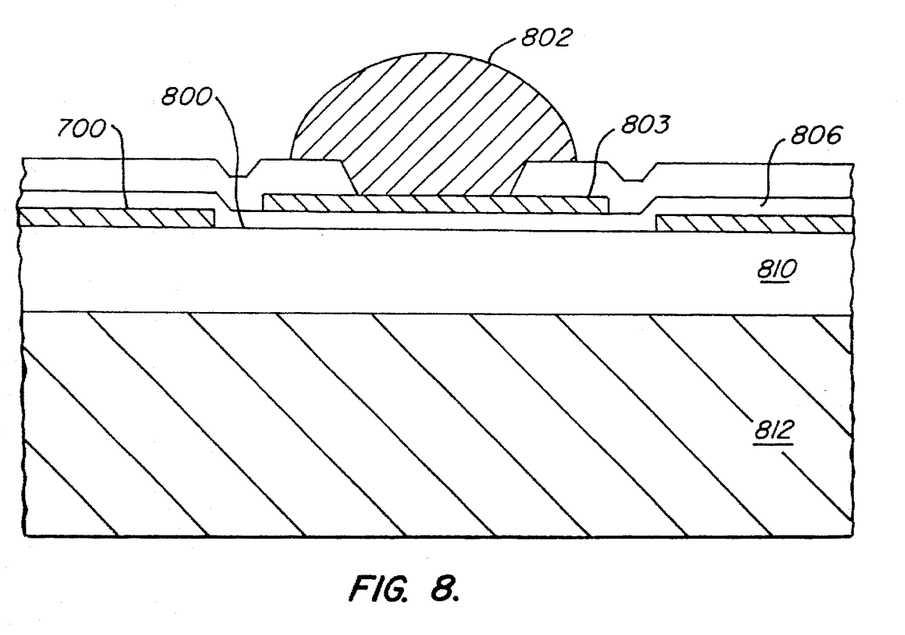
FIG. 8 is a cross-sectional view of reflow of a deformable bump using integral thin film resistors according to an embodiment of the present invention.

One possible structure for implementing reflow using resistors is shown in FIG. 8. In FIG. 8, a thin-film resistor 800 is located directly underneath the solder bump 802 and associated bond pad 803. In one embodiment of the invention, resistor 800 is made of tantalum nitride ($Ta_2N$) and is approximately 0.1–0.2 µm thick, providing a sheet resistance of 10Ω/square. Resistor 800 is electrically isolated from bond pad 803 by a relatively thin intervening dielectric layer 806. In the preferred embodiment of the invention, 2 µm of $SiO_2$ is used. $SiO_2$ is a suitable material for this application because of its relatively high thermal conductivity. Resistor 800 sits on top of a base layer 810 of $SiO_2$ dielectric which is 10 µm thick in this example. Base layer 810 provides a certain amount of thermal insulation between resistor 800 and the silicon substrate 812. Thus, resistor 800 can be heated up above the melting point of bump 802 without an excessive amount of power being required. Note that the use of thin-film resistors as localized heaters does not add any process steps to fabrication of the test substrate because resistors are already an integral part of the wafer-level burn-in concept for the purpose of electrical isolation of signals.

To reflow the bumps, an electrical pulse is applied to the resistor for 5–10 milliseconds, melting the solder bump for approximately the same length of time. This time interval was selected empirically based on laser reflow experiments, and is also based on the following theoretical arguments. For example, the relevant physical equilibration times of the system as described above in connection with FIG. 8 are:

1) For the resistor over dielectric, a thermal time constant of $h^2/\alpha=0.11$ ms. For the example of FIG. 8, h=10 µm is the underlying dielectric thickness and $\alpha=0.009$ cm²/s is the thermal diffusivity of amorphous $SiO_2$.

2) For the solder bump itself, a thermal time constant of $r^2/\alpha=0.12$ ms; in the example of FIG. 8, r=35 µm is the solder bump radius, and $\alpha=0.1$ cm²/s is molten solder's approximate thermal diffusivity.

3) For the molten solder bump, a hydrodynamic damping time (i.e., time constant of the physical reflow process) of $0.2r^2/\nu=1.2$ ms as established by Levich, Physicochemical Hydrodynamics, pp. 599–608, 1962 and Marella et al., Modeling of laser planarization of thin metal films, Applied Physics Letters, 54:12 pp. 1109–1111, (1989). In the example of FIG. 8, r=35 µm is the radius and $\nu=0.002$ cm²/s is the kinematic viscosity of the molten solder.

Note that the hydrodynamic damping time is an order of magnitude longer than the thermal time constant, a natural consequence of the low Prandtl number ($Pr=\nu/\alpha=0.02$) of liquid metals. Thus, the minimum reflow time will primarily be limited by the hydrodynamic damping time which is the time required for the molten solder to physically reshape itself into a hemisphere under the driving force of its own surface tension, moderated by the effects of inertia and viscosity. Since in the present example, this time period is estimated at 1.2 ms the heat pulses are at least that long to ensure a consistent reflow. In a preferred embodiment of the invention the heat pulses are 5 times the hydrodynamic damping time, i.e., 6 ms, to be completely sure that all motion has ceased. On the other hand, there is no real advantage to making the pulse significantly greater than 8 times the hydrodynamic damping time (~10 milliseconds) because the extended time period only increases the opportunity for oxidation and metallurgical reactions to occur.

In the example shown in FIG. 8, the resistor power Q required to reach and maintain the solder melting point (approximately 300° C. above room temperature for lead solders, is initially estimated to be approximately 0.3 Watts, which corresponds to a current of 170 mA and a voltage of 1.7 V for a 10Ω/square resistor. This initial estimate of the resistor power required to reach and maintain the solder melting point may be based on the formula $Q=k(\Delta T)(A/h)$, where k=0.014 W/cm-°C. is the $SiO_2$ thermal conductivity, A=(80 µm)² is the resistor area, and h=10 µm is the underlying dielectric thickness. In general, wiring a large number of heater resistors in a single series chain optimizes the simultaneous reflow benefits of the resistor reflow process. For example, given the values above, a burn-in substrate containing 100 solder bumps would require an electrical pulse of 100×1.7=170 Volts and 170 mA if the resistors are all in series. This value is well within the dielectric breakdown capabilities of the $SiO_2$ layers used. To handle still more solder bumps (such as in a wafer-scale burn-in application) without further increasing the voltage to unsafe levels, groups of such chains can be connected in parallel. In this way, the number of extra pins or pads required to conduct the resistor reflow process is minimized.

The electrical pulse to heat the resistors and hence reflow the solder bumps may be supplied from a commercial pulsed power supply. An adequate, low-cost substitute for such a power supply could be fabricated using a simple transistor switching circuit and charged capacitor. Upon activating the switch, the capacitor is electrically connected to the circuit and discharges its energy into the resistor bank; the capacitor may optionally be disconnected in a partially discharged condition after a certain time interval. This approach requires that the time constant R§C/2 of the overall resistor-capacitor combination be significantly greater than the desired pulse width, i.e., R§C/2>>6 ms. The factor of ½ is selected because of the exponential decay of energy which is proportional to the square of voltage and hence has twice the decay rate. In the 100 bump example discussed above, the resistance of the series chain is 100§10Ω=1 kΩ, and so a capacitor with a breakdown voltage rating of 300 V and a capacitance of 50 µF (R§C/2=25 ms) suffices. In this example, the pulse durations are relatively long and the currents relatively low thereby avoiding problems associated with circuit inductance or with capacitor internal resistance. An economical electrolytic type of capacitor may therefore be used for this application despite its high internal dissipation factor.

Figure 9:
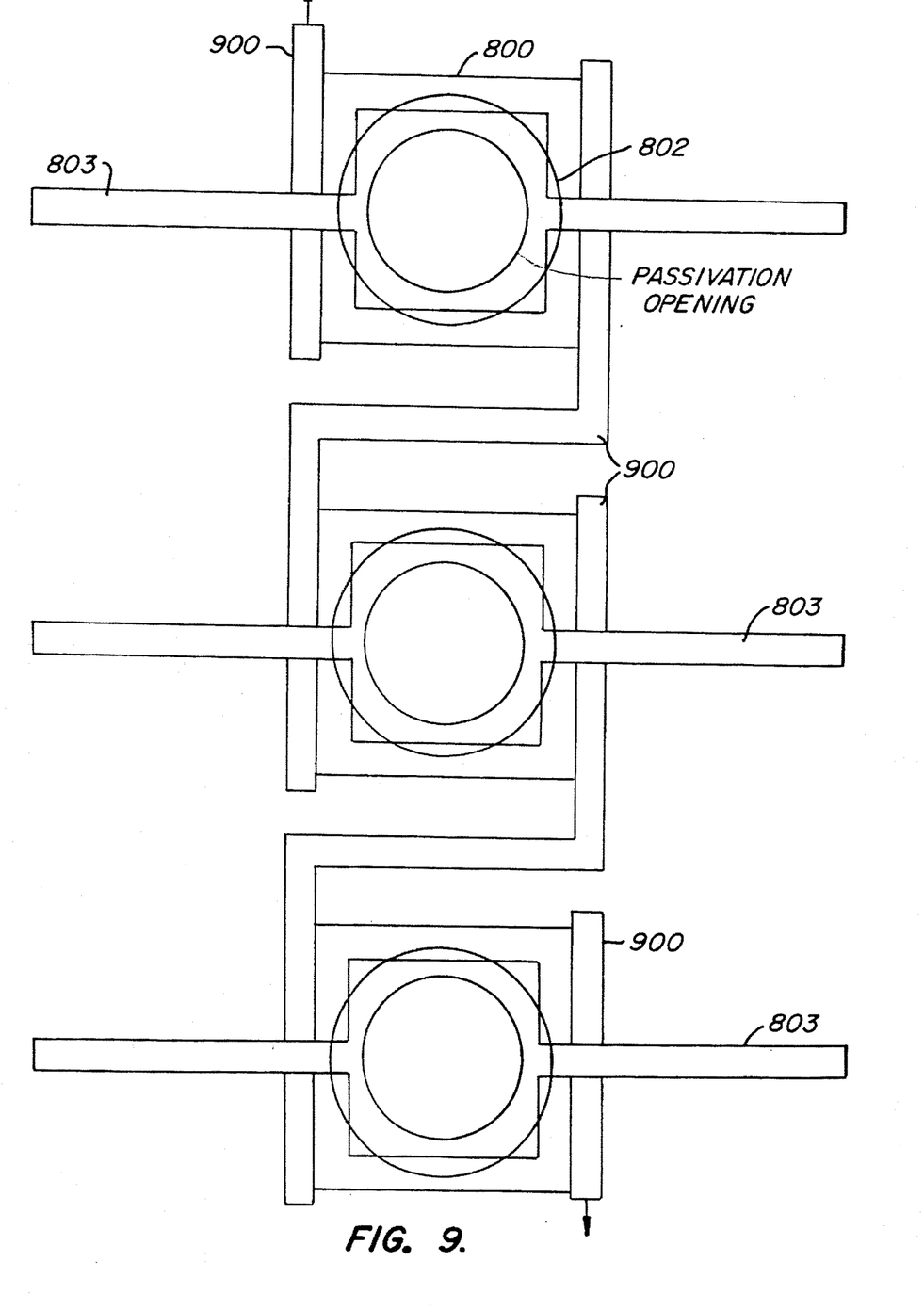
FIG. 9 is a plan view of heater resistors according to an embodiment of the present invention.

Although the preceding analysis of resistor power requirements are based on one-dimensional static heat flow approximations, the actual situation may be more complicated. FIG. 9 shows a plan view of heater resistors organized in a series chain. In the structure of FIG. 9, the lateral heat flow along the electrodes 900 leading to the resistor, and along the connections 803 to the bond pad, is not negligible, because the metal interconnect is more than 2 orders of magnitude more thermally conductive than the $SiO_2$ dielectric. Besides increasing the power requirements, these "heat leaks" have the effect of heating up neighboring solder bumps. This effect can result in the solder bumps being heated to different temperatures on different bond pad sites unless the design is symmetrically laid out and the bond pads are all perfectly evenly spaced in a ring around the chip perimeter, in which case the translational symmetry of the situation demands that the temperatures be fairly uniform from bump to bump. Such a layout is feasible in some chip designs but not in others. For example, an isolated bump will in general be cooler than a bump with close neighbors that are also being heated. Minor solder bump temperature differences should not be a serious problem because enough power can be applied to ensure that even the coldest solder bump receives enough heat to melt. However, the hottest solder bump should not approach or exceed the melting point of the interconnect metal: for example, 660° C. when aluminum is used as the interconnect metallization. Thus, the amount of bump temperature variability is not limitless. In a preferred embodiment of the present invention, variations in bump thermal resistance and nearest neighbor thermal coupling are together limited to about ±30%.

Temperature differences can also be modeled with finite element modeling, and individual resistors can then be "shimmed", e.g., by changing their sizes or shapes somewhat to reduce the predicted temperature differences. Since there are practical limitations to the accuracy of such three dimensional modeling and the extent to which individual resistors can be shimmed, building the burn-in substrate in such a way as to minimize the lateral heat leaks so that the non-uniformities will be minimized even without any shimming has additional advantages. Resistor shimming can then be used as an additional "fine tuning", if needed.

FIG. 9 also illustrates one possible design method to minimize the lateral heat leakage through metallization. Both resistor electrodes 900 and bond pad connections 803 are designed to their minimum practicable widths (10 μm in this example). In addition, layers 900 and 803 are routed away from the bond pads at minimum practicable width for a substantial length prior to making connection to other large metal areas (not shown) to maximize the lengthwise thermal resistance of the conductor and also the thermal resistance in the vertical plane to the silicon substrate.

The heat leak from a thin-film wire can be treated as a classical heat sink fin where heat can conduct along the length of the wire (fin) and also transfer directly in a perpendicular direction with a uniform heat transfer coefficient. In this case a conduction path to the silicon substrate exists. The heat transfer coefficient to the silicon substrate is simply:

$$F \cdot [K_{(SiO_2)}/h_{(SiO_2)}]$$

where: F is a "fringe factor" which accounts for lateral thermal spreading (1 for wide metal and thin dielectrics but around 2 in this example where the metal width and dielectric thickness are equal), and $k_{SiO2}=0.014$ W/cm-°C. and $h_{SiO2}=10$ μm are the thermal conductivity and thickness of the SiO$_2$ underlayer. The lengthwise heat conduction can be modeled as a thermal sheet resistance $R_S=1/k_{metal}h_{metal}=2.2°$ C./mW per square, where $k_{metal}=2.3$ W/cm-°C. is the thermal conductivity of aluminum and $h_{metal}=2$ μm is the film thickness. Then, the "fin efficiency" is:

$$\eta = [\tanh(L/\lambda)/(L/\lambda)], \text{ where:}$$

$$\begin{aligned}\lambda &= (h_{SiO2} \cdot h_{metal} \cdot k_{metal}/F \cdot k_{SiO2})^{1/2} \\ &= (10 \text{ μm} \cdot 2 \text{ μm} \cdot 2.30 \text{ W/cm}-°C./2 \cdot 0.014 \text{ W/cm}-°C.)^{1/2} \\ &= 40 \text{ μm}\end{aligned}$$

is the exponential decay length of the temperature profile of the "fin" (i.e., the conductor stripe). Thus, for this present example, a minimum line width does not need to be run beyond a length of 100 μm or so.

For an infinitely long conductor (L→∞), the fin efficiency asymptotically approaches zero as $\eta \approx \lambda/L$, and the fin is then equivalent in its overall effectiveness to a perfectly efficient fin of length λ. So an upper bound on the heat transfer from the 10 μm conductor in this example can be calculated by considering the resistor to have its area extended by F·(10 μm)·(40 μm), or about an additional 12.5% for each conductor extending from the resistor area. In typical applications four such extensions exist: two electrodes for each resistor, and two signal connections at opposite ends of the signal pads for routing. In addition, parallel resistor electrodes 900 need to be considered since they are tightly thermally coupled to resistor 800. In the present example, electrodes 900 are an additional 10 μm×80 μm in dimension on each side. Additionally the fringing effect around the resistor pattern will add approximately another 5 μm effective border, i.e., an additional 1800 (μm)$^2$. Thus, the total effective area of resistor 800 is about:

(80·80)+(4·2·10·40)+(2·10·80)+1800=13000 (μm)$^2$.

Therefore, using the more detailed analysis, a power of 0.6 watts (2.45 V, 245 mA), rather than 0.3 Watts, is preferred in this particular example to reflow the solder bump due to these parasitic "heat leaks". Further refinements on this analysis can be achieved using finite element modeling.

Figure 10:
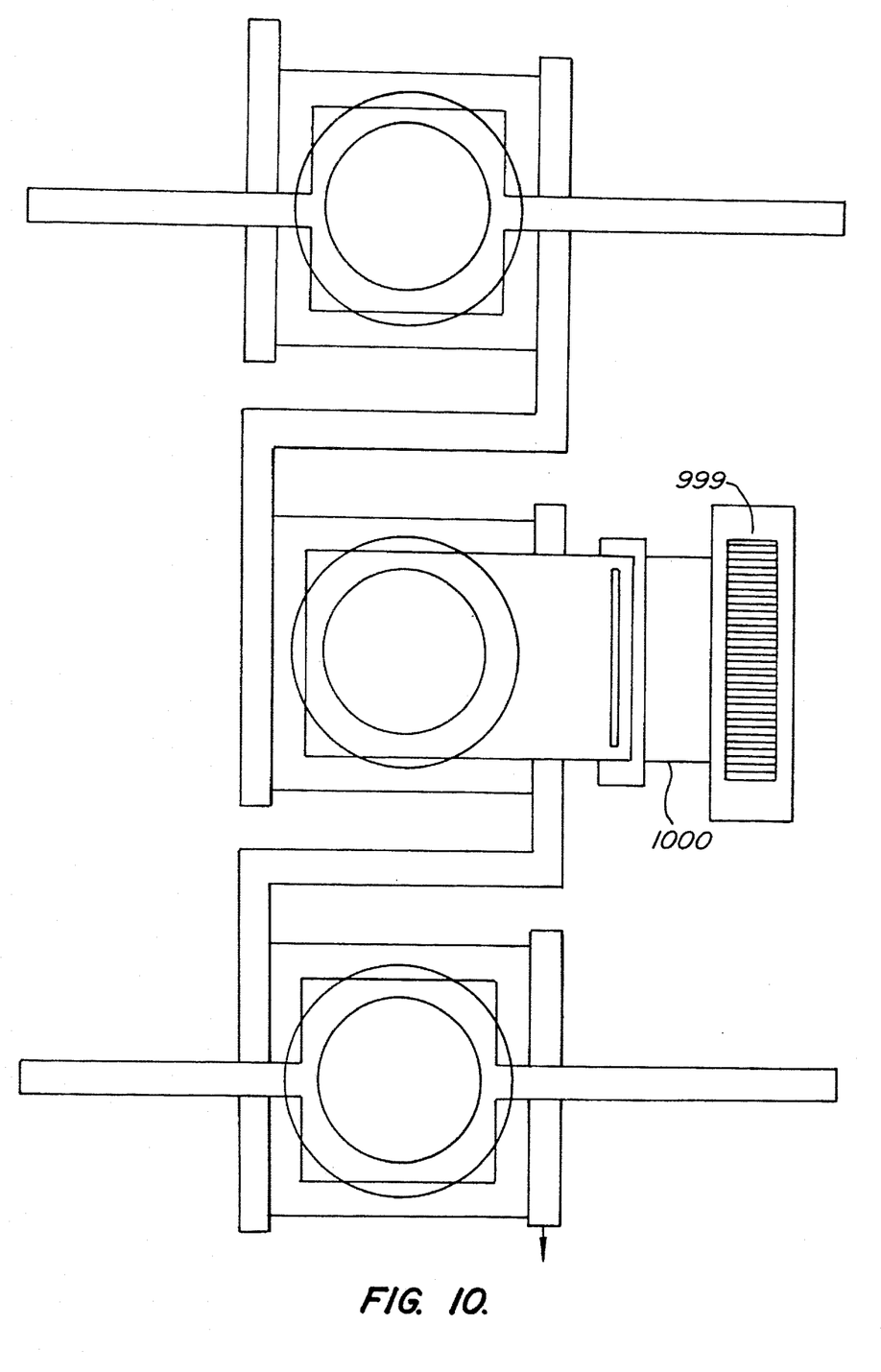
FIG. 10 is a plan view of a power supply pad in series with a current limiting resistor according to an embodiment of the present invention.

Attention to thermal and electrical design is also desired when designing the substrate's power and ground pads which connect through the solder bumps to power and ground pads on the die or wafer under test. Due to electromigration concerns at the high burn-in temperatures, the cross sectional areas of conductors feeding the bond pads are relatively large. Continued dc operation at elevated temperatures may eventually lead to an open-circuit failure on the burn-in substrate if the designer neglects this issue. One solution if and when such an issue develops with a particular design, is use of a more electromigration resistant metallization such as Al-Cu or Cu. Another alternative would be to connect a Ta$_2$N thin-film current-limiting resistor 1000 directly around the perimeter of the power pad 909 and electrically in series with the power pad as shown in FIG. 10. The current limiting resistor has less tendency to transfer heat than Al or Cu metallization because it is 10–20 times thinner and has 5–10 times lower thermal conductivity than Al or Cu. Such resistors also prevent burn-out of the substrate when an integrated circuit under test develops a power-to-ground short during burn-in. A third possible solution would be to "shim" the resistor value as discussed previously by modifying the designed size or shape so that the correct solder reflow temperature is achieved despite the higher heat leak associated with the power or ground feeder electrodes.

The resistor reflow process requires a minimum of only two additional pins or pads on the substrate. More might be used to minimize power supply size in wafer-scale applications involving very large numbers of bumps. The power supply and nitrogen flush may be integral to the burn-in system and automated. The user could thus be completely unaware that a reflow step was being performed automatically in a fraction of a second, prior to loading a new batch of dice or wafers.

In addition to the laser and resistor reflow techniques previously described, the bumps may also be reworked by reconstituting the bumps. The test substrate is dipped in a pot of molten solder and then withdrawn. Solder dipping has been described above under the heading Dot Fabrication Techniques. Reworking the solder bumps by solder dipping is likely to work best if the solder bumps were originally formed by solder dipping.

The ability to reflow the bumps after a burn-in cycle allows the test device of the present invention to be employed many times. The cost of the test substrate is thus amortized over many uses and thereby significantly reduces test costs. In addition, rework capability of the deformable bumps may be employed advantageously in assembly of MCMs using adhesive flip chip processes (as described in U.S. Pat. No. 4,749,120 to Hatada). In the present invention a chip which is improperly attached or which later proves defective, may be removed and the solder bumps reflowed. The chip may then be reattached or a new chip attached to complete the MCM assembly. The rework capability and the present invention can therefore also reduce the cost of assembling MCMs.

Table 1 lists many of the advantages of the invention as described above. Preferred embodiments of the present invention have now been described. Variations and modifications will be readily apparent to those of skill in the art. For this reason, the invention should be considered in light of the claims.

TABLE 1

Tolerant of continual operation at junction temperatures 125° C.–150° C. or higher.

Suitable for wafer-scale use. The cost, complexity, and risk of damage associated with handling, aligning and fixturing large numbers of individual die is formidable. Wafer-scale burn-in avoids these difficulties, allowing the use of simple fixtures, and potentially large cost savings. Wafer-scale burn-in as described here includes capability of independently powering discrete chips.

Area array capability. While the vast majority of contemporary IC's use only a single row of perimeter I/O pads, multiple rows or full area array IC's can also be tested.

Fine-pitch capability. While present commercial applications seldom go below 100 μm pitch, the invention allows testing 50 μm pitches or smaller which will be in production by the end of the decade.

Reusability of the burn-in substrate.

Low cost.

Acceptable to the IC manufacturers. Because many manufacturers are reluctant to sell wafers (for reasons of yield data and test structure confidentiality), the burn-in capability can be a part of the IC manufacturer's process.

Tolerant of essentially uncontrolled atmospheres. For both economic and logistical reasons, it is desirable to avoid inert atmospheres for burn-in.

Zero pad contamination. The subsequent bondability of the I/O pads is not impaired.

Predictable heat transfer characteristics.

Modest compressive force requirements. Achieving good contact with a pressure of ≦12 psi is of particular value, because it makes possible the use of atmospheric pressure as the source of the compressive force.

What is claimed is:

1. A test apparatus for testing at least one integrated circuit having contact pads, the apparatus comprising:
   a test substrate including an interconnect layer including a heater resistor;
   means for coupling the test substrate to a source of test signals; and
   a plurality of electrically conductive non-rigid deformable bumps disposed between a region of the interconnect layer of said test substrates adjacent said resistor and individual contact pads of the at least one integrated circuit to provide electrical contact between the test substrate and at least one integrated circuit, whereby said heater resistor is capable of providing heat to a deformable bump.

2. The test apparatus of claim 1, wherein said test substrate further comprises:
   a conducting plane; and
   an insulating layer disposed between said interconnect layer and said conducting plane.

3. The test apparatus of claim 1, wherein said electrically conductive deformable bump has a melting point less than a maximum temperature at which said test substrate retains functionality.

4. The test apparatus of claim 1, further comprising a current limiting resistor coupled in series between said interconnect layer and a power supply.

5. The test apparatus of claim 4, wherein said power supply comprises a discrete metal layer.

6. The test apparatus of claim 1, further comprising a means for holding said at least one integrated circuit in contact with said deformable bumps.

7. The test apparatus of claim 6, wherein said means for holding further comprise a sealed pressure vessel including:
   (i) an interior chamber containing said at least one integrated circuit and said deformable bumps; and
   (ii) means for pressurizing said interior chamber, whereby said at least one integrated circuit is held in contact with said deformable bumps.

8. The test apparatus of claim 1, further comprising a temperature regulator including:
   (i) a heat sink attached to said substrate;
   (ii) a temperature measuring device mounted on said heat sink; and
   (iii) a control system coupled to said temperature measuring device.

9. The test apparatus of claim 1, wherein the test substrate further includes a plurality of bond pads and wherein a metallization layer provides a plurality of resistors connected in series wherein each of said plurality of bond pads is associated with one of said plurality of resistors.

10. The test apparatus of claim 1, wherein said means for coupling include at least one electrical feedthrough extending through said substrate to said interconnect layer.

11. A test apparatus according to claim 1 further comprising means for passing current through said heater resistor to reflow said deformable bump.

12. A method for testing an integrated circuit comprising the steps of:
   forming a heater resistor on an interconnect layer of a test substrate;
   forming a deformable, electrically conductive bump on the interconnect layer of the test substrate in a region proximate to said heater resistor;
   placing a contact pad of the integrated circuit in removable contact with said deformable electrically conductive bump;
   supplying a plurality of test signals to said test substrate to exercise said integrated circuit;
   supplying electric current to said heater resistor to generate heat energy.

13. The method of claim 12, further comprising the step of actively controlling a temperature of said test substrate and said integrated circuit whereby a burn-in test may be conducted without a burn-in oven.

14. The method of claim 12, wherein said heat energy reflows said deformable bump to reform said deformable bump.

15. The method of claim 12, wherein said step of forming a heater resistor further comprises forming a plurality of resistors in series wherein each of said plurality of resistors is associated with a unique one of said deformable bumps.

16. The method of claim 12, further comprising the step of ablating a selected contact pad using a laser to prevent operation of a given integrated circuit during testing of a device wafer having a plurality of integrated circuits.

17. The method of claim 12, wherein said step of supplying a plurality of test signals further comprises the step of providing at least one electrical feedthrough extending through said substrate to said interconnect layer.

18. A method for burning-in an integrated circuit comprising the steps of:

forming a resistor on an interconnect layer of a test substrate;

forming a deformable, electrically conductive bump on an interconnect layer of a test substrate and proximate to said resistor;

placing a contact pad of the integrated circuit in removable contact with said deformable electrically conductive bump;

supplying a plurality of test signals to said test substrate to exercise said integrated circuit;

supplying current to said resistor after said integrated circuit has been tested, to generate heat energy for reflowing said deformable bump to form a new deformable bump;

placing a contact pad of a second integrated circuit in contact with said new deformable bump; and supplying a plurality of test signals to said test substrate to exercise said second integrated circuit.

19. The method of claim 18, further comprising the step of actively controlling a temperature of said test substrate and said integrated circuit whereby a burn-in test may be conducted without a burn-in oven.

20. The method of claim 18, wherein said step of forming a resistor further comprises forming a plurality of resistors in series wherein each one of said plurality of resistors is associated with a unique one of said deformable bumps.

21. The method of claim 18, wherein said step of supplying test signals further comprises the step of providing at least one electrical feedthrough extending through said substrate to said interconnect layer.

22. A test apparatus for testing at least one integrated circuit having contact pads, the apparatus comprising:

a test substrate including:
(a) a base;
(b) a conducting plane;
(c) an interconnect layer including a resistor;
(d) an insulating layer disposed between the interconnect layer and said conducting plane;

means for coupling the test substrate to a source of test signals; and a plurality of electrically conductive non-rigid deformable bumps disposed between a region of the interconnect layer of said test substrate adjacent said resistor and individual contact pads of the at least one integrated circuit to provide electrical contact between the test substrate and at least one integrated circuit, whereby said resistor is capable of providing heat to at least one of said plurality of deformable bumps.

* * * * *